United States Patent
Wimmer et al.

(10) Patent No.: US 6,870,719 B2
(45) Date of Patent: Mar. 22, 2005

(54) PLAUSIBILITY CHECKING OF CURRENT TRANSFORMERS IN SUBSTATIONS

(75) Inventors: Wolfgang Wimmer, Rietheim (CH); Jan Schutter, Nussbaumen (CH)

(73) Assignee: ABB Schweiz AG, Baden (CH)

( * ) Notice: Subject to any disclaimer, the term of this patent is extended or adjusted under 35 U.S.C. 154(b) by 5 days.

(21) Appl. No.: 10/388,522

(22) Filed: Mar. 17, 2003

(65) Prior Publication Data

US 2003/0184936 A1 Oct. 2, 2003

(30) Foreign Application Priority Data

Mar. 26, 2002 (EP) ............................................ 02405235

(51) Int. Cl.⁷ ........................ G01R 19/00; G01R 31/02
(52) U.S. Cl. .......................... 361/36; 361/35; 700/292; 700/295; 700/297; 324/500; 324/512
(58) Field of Search ................................ 700/292, 295, 700/297; 361/35, 36

(56) References Cited

U.S. PATENT DOCUMENTS

| | | | | |
|---|---|---|---|---|
| 3,832,600 A | * | 8/1974 | Specht | 361/36 |
| 4,216,513 A | * | 8/1980 | Tokuyama et al. | 361/13 |
| 4,237,512 A | * | 12/1980 | Forford | 361/87 |
| 4,402,028 A | * | 8/1983 | Udren | 367/36 |
| 4,631,622 A | * | 12/1986 | Howell | 361/45 |
| 4,661,877 A | * | 4/1987 | Usui | 361/36 |
| 4,871,971 A | * | 10/1989 | Jeerings et al. | 324/509 |
| 5,170,308 A | * | 12/1992 | Inagaki et al. | 361/36 |
| 5,241,443 A | * | 8/1993 | Efantis | 361/36 |
| 5,245,498 A | * | 9/1993 | Uchida et al. | 361/47 |
| 5,408,176 A | * | 4/1995 | Blatt | 324/107 |
| 5,428,549 A | * | 6/1995 | Chen | 702/59 |
| 5,455,776 A | * | 10/1995 | Novosel | 702/59 |
| 5,469,051 A | * | 11/1995 | Yarmchuk | 324/158.1 |
| 5,566,041 A | * | 10/1996 | Rumfield | 361/115 |
| 5,600,526 A | * | 2/1997 | Russell et al. | 361/65 |
| 5,661,664 A | * | 8/1997 | Novosel et al. | 700/293 |
| 6,453,248 B1 | * | 9/2002 | Hart et al. | 702/58 |

FOREIGN PATENT DOCUMENTS

| | | |
|---|---|---|
| DE | 4142471 A1 | 7/1992 |
| EP | 1074849 A2 | 2/2001 |

* cited by examiner

*Primary Examiner*—Leo Picard
*Assistant Examiner*—Michael D. Masinick
(74) *Attorney, Agent, or Firm*—Burns, Doane, Swecker & Mathis, L.L.P.

(57) ABSTRACT

The invention relates to a method, a computer program and a device (20) for the plausibility checking of current transformers (7) in an electrical switchgear assembly (1) and to a switchgear assembly (1) having such a device (20). According to the invention, zones (1a, 1b, 1c) bounded by current transformers (7) and possibly by open switches (3–5) are detected for an instantaneous topology of the switchgear (1), in each zone (1a, 1b, 1c) the signed current measurement signals are added and in the case of significant deviations of the current sum from zero, all current transformers (7) of the associated zone (1a, 1b, 1c) are identified as being problematic. Exemplary embodiments relate to, among other things: a warning counter (2e) for problematic current transformers (7); in the case of a defective current transformer (7), an operation with calculated currents or an automatic combining of zones (1a, 1b, 1c); and coordinating the plausibility test with switching actions. Advantages are, among other things: the method is independent of the complexity and operating state of the switchgear (1); dynamic topology tracking; high information content of the plausibility test; and access to current measuring values already available in the substation control system (2).

23 Claims, 2 Drawing Sheets

PLAUSIBILITY CHECKING OF CURRENT TRANSFORMERS IN SUBSTATIONS

FIELD OF THE INVENTION

The invention relates to the field of system control technology, in particular to the substation control technology for high, medium or low voltage switchgear assemblies.

BACKGROUND OF THE INVENTION

A power supply network comprises substations or electrical switchgears, in particular high or medium voltage switchgears which are controlled by a distributed substation control system. The substations comprise primary or field devices, e.g. switches, drives, generators, transformers, voltage and current transformers. The control system has, for example, field control devices and a control station which are connected to one another by means of various communication buses and bus couplers. The field control devices control, monitor and protect the field devices of the system.

Current transformers in electrical substations measure the system currents at predetermined measuring points of the switchgear with a certain measurement inaccuracy. The measuring points are typically located at all incoming and outgoing lines and possibly also within the system, e.g. for the busbar protection. The current measurement values are filtered, scaled to primary current values of the system, digitized, if necessary, and detected as current measurement signals by the control system. For communication purposes, additional rate-of-change filtering can be provided which e.g. comprises temporal averaging by integration or an algorithm for deciding about updating or retaining and transmitting or not transmitting the current measurement value. The current measurement signals are used for protective functions, for monitoring the substation, for calculating performance data for operating purposes or for consumption billing and for the representation on a display. Both the measurement values detected by the current transformer and the parameters of the filtering and scaling, i.e. the so-called parametrisation of the measurement values can have errors. Primary errors in the current transformer itself are produced e.g. by defective parts or material fatigue. Errors in the parametrisation or in the power calculation can be caused in the electronics by external influences, aging, drift, errors by the operating personnel or the like. Errors in the transmission of measurement values or measurement signals can occur in the device and function chain from the current transformer to the screen display or power system control center.

For protection purposes, it is known to monitor the current transformers by means of local plausibility tests at an isolated point of the facility. During the phase balance supervision test, all three phase currents and the neutral current are measured at one point in the line and deviations from an assumed maximum asymmetry between the phases are detected. During the comparison test of current and voltage values, coarse inconsistencies between voltage and current values can be discovered at the measuring point. These local plausibility tests related to a single measuring point are very coarse and only permit a yes/no decision, whether a current transformer is operating or not. Wrong scaling or a loss of accuracy, in contrast, cannot be detected, particularly since the tests in the protective device are performed, as a rule, with relative values to the nominal voltage.

In differential protection for transformers, the currents of the high-voltage end and the low-voltage end are measured, provided with a scaling factor given by the transformation ratio of the transformer and compared with one another. This makes it possible to detect and correct scaling errors for the differential protection.

Such tests are performed in protective devices for protective current transformers. In general, such algorithms cannot be used in control devices for measuring-type current transformers, because, as a rule, transducers are used for digitizing the current measurement values and these supply, instead of the instantaneous values needed, time-averaged RMS or effective values of the current, the voltage or the power, the frequency or the phase angle.

SUMMARY OF THE INVENTION

It is an object of the present invention to specify a method, a computer program, a device and a switchgear with such a device for the improved and simplified monitoring of current transformers in electrical switchgears.

In a first aspect, an exemplary embodiment of invention includes a method for the plausibility checking of current transformers in an electrical switchgear, in particular a high-voltage or medium-voltage switchgear, the switchgear being controlled by a control system and measuring signals from current transformers arranged at at least two different measuring points being processed by the control system, the following steps being performed for the plausibility testing of the current transformers: (i) recording an instantaneous topology of the switchgear by the control system on the basis of the existing electrical connections of primary devices and of instantaneous positions of switches; (ii) based on the instantaneous topology, identifying at least one zone of the switchgear, which zone represents a conductively connected area which is bounded by at least one current transformer and possibly by open switches; (iii) detecting the measuring signals of the current transformers in the zone with a current-direction-dependent sign and adding the measurement signals to form a current sum of the zone; and (iv) testing the current sum for a value zero within a permissible current transformer measurement accuracy and marking the current transformers of the zone as problematic, if the current sum is not equal to zero.

Thus, each zone represents a current node, the current sum of which is ideally zero. Open switches can be assigned a current measuring value of zero since they correspond to current transformers with a nominal current of zero. The test of the current sum for deviations from the ideal value of zero represents a simple, efficient method for checking, by means of a relative comparison of the current transformers of a zone, their scaling within permissible measurement signal deviations. The method requires little computing effort and no additional measuring expenditure in the current transformers. In particular, it is not necessary to know or estimate a correct or absolute current value. The identification of current transformers as problematic represents a first warning or alarm stage and signals that further monitoring of the current transformers of this zone is required. The method is independent of the configuration or the network arrangement of the primary devices of the switchgear and, in particular, independent of the complexity of their networking and, therefore, can be implemented for any desired arrangements without significant adaptations. The method is also independent from the instantaneous operating state of the switchgear and, in particular, can also be performed with fluctuating current values. Tracking the topology is done dynamically, i.e. the topology or the division into zones is updated continuously or on demand. In particular, it can change due to switching actions. It is also advantageous that measuring signals of the current transformers already available in the control system can be accessed. The method is also compatible with conventional local plausibility tests for current transformers. Going beyond these, however, it allows slight deviations or errors in the scaling of current transformers to be detected. More severe faults or defects on the primary side of current transformers can also be detected.

A preferred exemplary embodiment comprises the following features: in each zone, the same number of tests for the presence of a current sum not equal to zero is performed; in each test for the presence of a current sum not equal to zero, a warning counter for the current transformers identified as being problematic in this zone is incremented; and, finally, current transformers having a higher warning count than other current transformers, particularly having a highest warning count, are identified as being defective. This is because, if a defective current transformer belongs to two or more zones, its warning counter is incremented with each formation of a current sum in its zones, whereas the other warning counters are only incremented by one unit. The higher or highest warning count is, therefore, a reliable measure for detecting the defective current transformer.

An exemplary embodiment wherein at least one zone includes a number of current transformers, and wherein the warning counters of the current transformers of this zone are reset to zero if a current sum equal to zero is measured in the zone and a measurement signal not equal to zero is measured on at least two current transformers of the zone, has the advantage that the warning signal of a current transformer which is arranged within the switch gear assembly and is not defective can be reset to zero immediately in dependence on the order of the formation of sums in the zones and the current transformer can be detected as intact.

An exemplary embodiment wherein, in a zone having one and only one current transformer, the current transformer is identified as being defective if its measurement signal is repeatedly not equal to zero, has the advantage that zones with one and only one current transformer can be monitored in a very simple and reliable manner.

An exemplary embodiment wherein each current transformer of the switch gear assembly is divided into at least one zone, and wherein in an overall test of the switch gear assembly one and only one test for the presence of a current sum not equal to zero is performed in each zone, has the advantage that the current transformers of the entire switch gear assembly can be checked by exemplary methods according to the invention.

An exemplary embodiment wherein the identification of the zones is based on a busbar of the switch gear assembly and all current transformers conductively connected thereto are searched out, and/or wherein two zones of the switch gear assembly are identified which are adjacent to one another and which adjoin one another via a common current transformer and if the common current transformer fails or if the common current transformer is detected as being defective, the two zones are automatically combined to form a single zone, has the advantage of particularly simple zone detection and fast combining of zones in the case of defective current transformers.

An exemplary embodiment wherein, when exactly one current transformer fails in one zone, a current measurement signal to be detected by this current transformer is calculated from the remaining current measurement signals of the zone, assuming that the current sum is equal to zero, has the advantage that it is possible to operate the switch gear assembly with calculated currents.

In other aspects, exemplary embodiments of the invention relate to a computer program for the plausibility checking of current transformers, the method steps being implemented by a program code, furthermore to a device for carrying out the method and to a switch gear assembly comprising the device.

Further statements, advantages and applications of the invention will be apparent from the description now following and the figures.

BRIEF DESCRIPTION OF THE DRAWINGS

In the figures, identical parts are provided with the same reference symbols.

DETAILED DESCRIPTION OF THE INVENTION

Figure 1A:
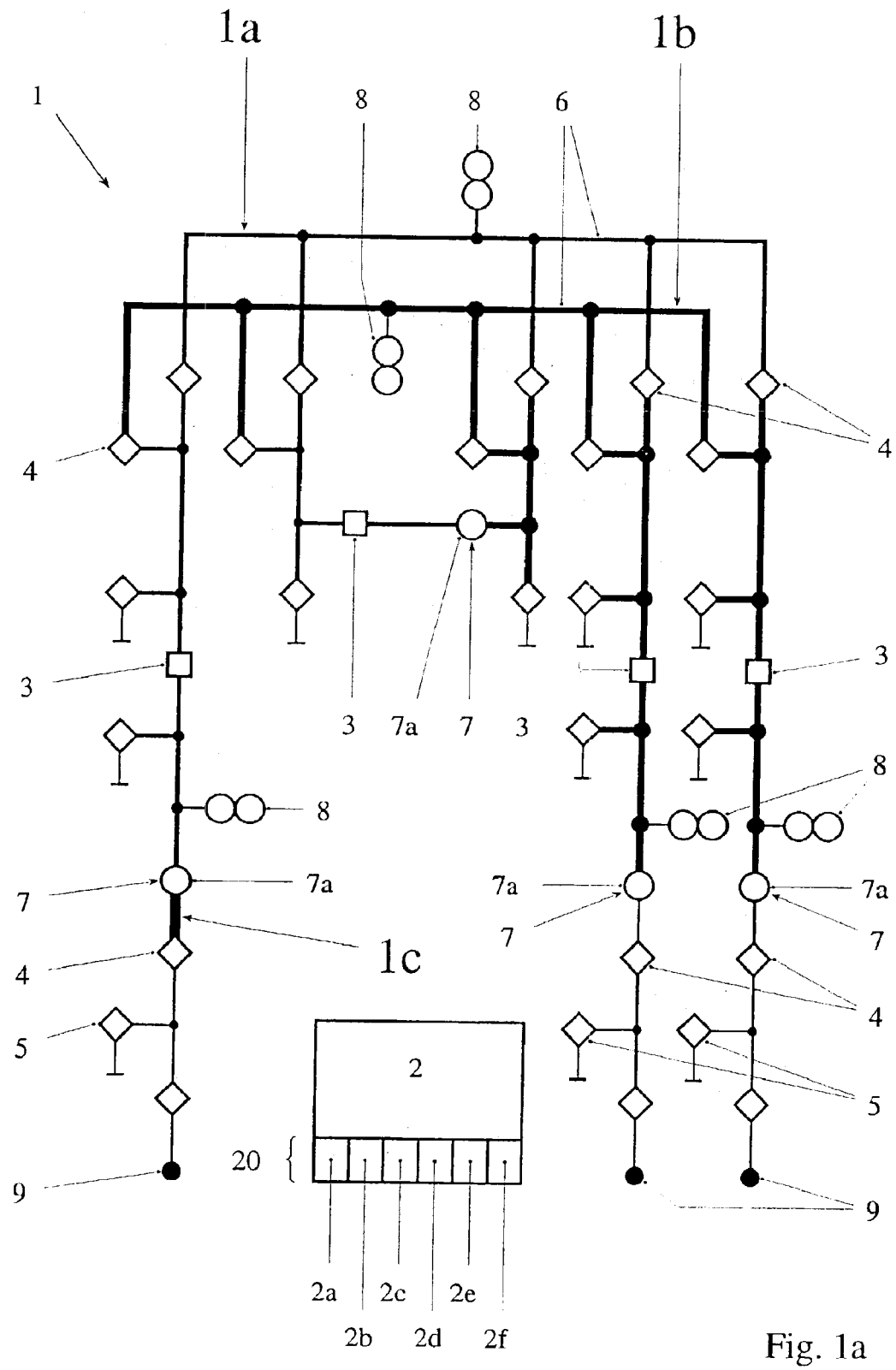
FIG. 1a shows a single-pole diagram in a first topological state defined by switch positions.
Figure 1B:
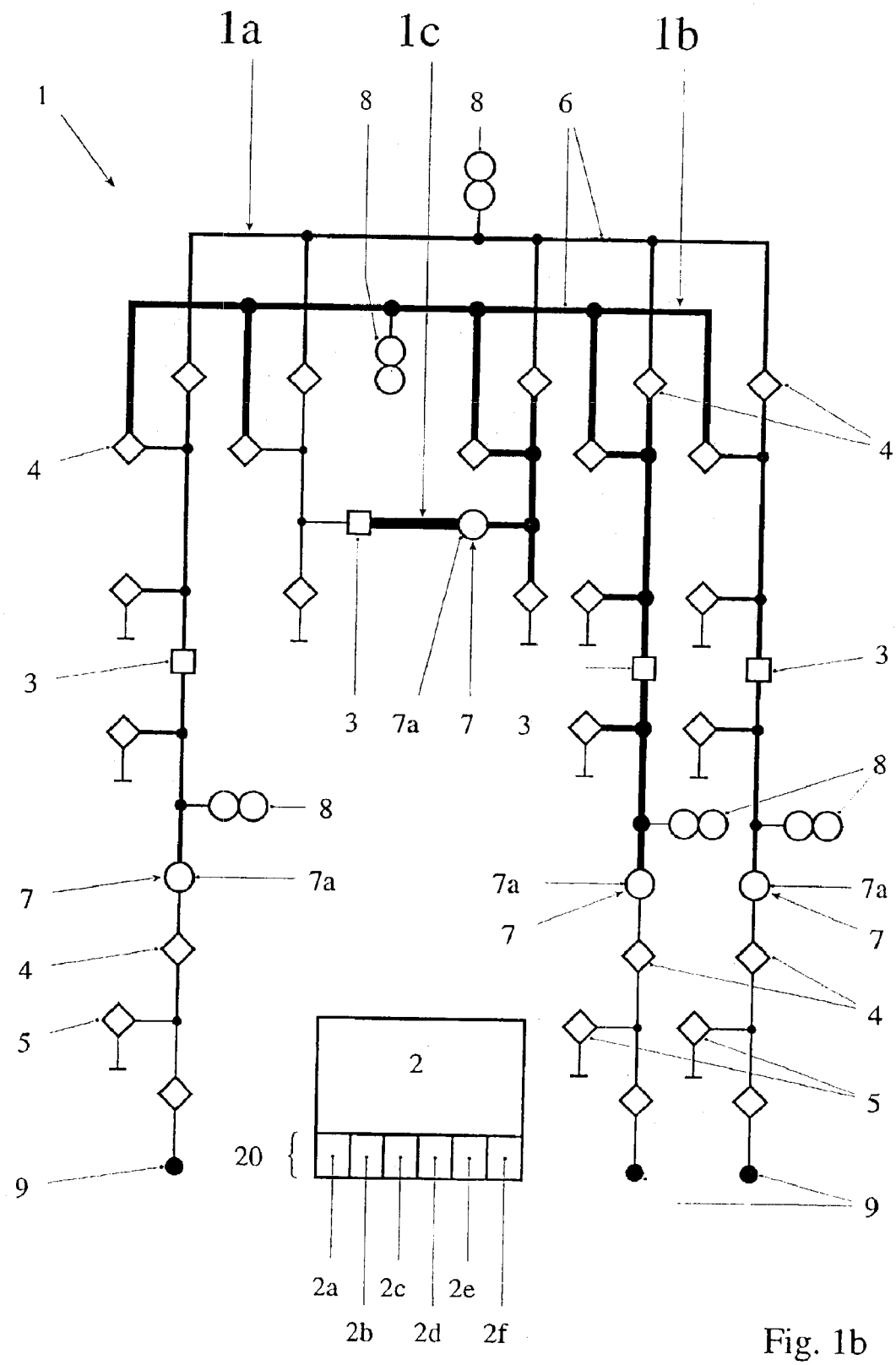
FIG. 1b shows the single-pole diagram in a second topological state.

FIGS. 1a and 1b show a single-pole scheme of an electrical high-voltage switchgear assembly 1. A control system 2 of the switchgear 1 is shown diagrammatically and without the connections to the primary devices 3–9 and without reference to its spatial arrangement. 1a, 1b, 1c designate topological sections or current areas or zones 1a, 1b, 1c which result from the instantaneously assumed position of circuit breakers 3, isolators 4 and earthing isolators 5. The busbars are designated by 6, the current transformers by 7, the voltage transformers by 8 and the outgoing lines or outgoers by 9.

In FIG. 1a, a first instantaneous topology with a first, second and third zone 1a, 1b and 1c is shown. The first zone 1a comprises a first current transformer 7 at the left-hand outgoing line 9 and a second current transformer 7 in the coupling part between the busbars 6. The adjoining zone 1b contains the second current transformer 7 and the third and fourth current transformer 7 at the right-hand outgoing line 9. The other adjoining zone 1c contains the first current transformer 7. All current transformers 7 are arranged at spatially separate positions 7a. According to an exemplary embodiment of the invention, the measurement signals of the current transformer 7 are detected separately with a current-direction-dependent sign in each zone 1a, 1b, 1c to be monitored and are added to form a current sum of the respective zone 1a, b, 1c and, if a current sum which is not equal to zero within a permissible current transformer measurement accuracy is present, all current transformers 7 of the respective associated zone 1a, 1b, 1c are identified as being problematic. The current sum is checked for zero within a permissible measurement error or on the basis of measurement inaccuracies of the current transformer 7 which are allowed and normally known a priori. If the current sums deviate from zero by typically more than the measurement inaccuracy, at least one current transformer 7 is presumably defective.

The transition from FIG. 1a to FIG. 1b occurs in that the substation control system 2, by tracing the topology, detects which positions of the switches 3–5 are instantaneously current. FIG. 1b shows a second topological operating state of the switchgear 1 in which zone 1a contains the first and fourth current transformer 7, zone 1b contains the second and third current transformer 7 and the new zone 1c contains the second current transformer 7. Adjacent zones, i.e. zones with a common current transformer 7, are zones 1a, 1b and 1a, 1c in FIG. 1a but not 1b, 1c and zones 1b, 1c in FIG. 1b. In the coupling part, there is also a line area which is not divided into zones and which is exclusively bounded by open switches 3 and isolators 4.

Thus, in the method, the current transformer measurement signals detected at various measuring points 7a within each zone 1a, 1b, 1c are compared with one another for consistency in that, when their current sum deviates from the ideal value of zero by more than a predetermined difference value, the current transformers 7 of the associated zone 1a, 1b, 1c are marked as being problematic. The difference value is typically greater than or equal to the measurement inaccuracy of the transformers 7.

In an advantageous embodiment, in each test of a zone 1a, 1b, 1c for the presence of a current sum not equal to zero, a warning counter 2e is incremented for the current transformers 7 graded as being problematic. If the zones 1a, 1b, 1c to be monitored are tested with the same incidence, current transformers 7 having a higher or having the highest warning count can be marked as being defective.

A higher or highest warning count is a reliable measure of defective current transformers 7: if in a zone 1c having exactly one current transformer 7, this transformer is defective, its warning counter 2e is incremented and all other warning counters 2e remain at zero. If the defective current counter 7 is a member in two adjacent zones 1a, 1b; 1a, 1c (FIG. 1a) or 1b, 1c (FIG. 1b), its warning counter 2e is incremented to twice the value of the intact current transformers 7 of these zones. If the defective current counter 7 is a member in a disjoint zone 1a (FIG. 1b) which does not overlap other zones 1b, 1c (FIG. 1b) and thus does not have a common current transformer 7, the warning counters 2e of all current transformers 7 of this zone 1a are uniformly incremented and the defective current transformer 7 can only be detected if another topology or zone division exists on the basis of switching actions. To provide identification, suitable switching actions can be carried out intentionally, if necessary, as long as these switching actions are compatible with the other requirements for the operation of the substations. In the text which follows, further exemplary embodiments are specified.

If there is at least one zone 1a, 1b having a plurality of current transformers 7, the warning counters 2e of the current transformers 7 of this zone 1a, 1b are reset to zero, if in the zone 1a, 1b a current sum equal to zero and by at least two current transformers 7 of the zone 1a, 1b a measurement signal not equal to zero is measured. In a zone 1a, 1b, 1c having exactly one current transformer 7, the current transformer 7 is identified as being defective, if its measuring signal is repeatedly not equal to zero.

Advantageously, each current transformer 7 of the switchgear 1 is divided into at least one zone 1a, 1b, 1c and in an overall test of the switchgear 1, exactly one test for the presence of a current sum not equal to zero is performed in each zone 1a, 1b, 1c. For simple identification of the zones one starts from a busbar 6 of the switchgear 1 and looks for all current transformers 7 conductively connected thereto.

If two zones 1a, 1b; 1b, 1c of the switchgear 1 are adjacent to one another and thus adjoin one another via a common current transformer 7, the two zones 1a, 1b; 1b, 1c can be automatically combined to form a single zone in the case of a failure of the common current transformer 7 or when the common current transformer 7 is detected as being defective.

In the case of a failure of exactly one current transformer 7 in a zone 1a, 1b, 1c, a current measuring signal to be detected from this current transformer 7 can be calculated from the remaining current measuring signals of the zone 1a, 1b, 1c, assuming a current sum equal to zero. The calculated current value can be used like a measured current measuring signal for monitoring operation or for billing.

The plausibility test of the current transformer 7 can be performed separately for each phase or alternately for various phases, in particularly cyclically alternately, or for average values of at least two phases, particularly all phases. In the operating state of the switchgear 1, tests for the presence of a current sum not equal to zero and, in particular, overall tests of the switchgear 1 can be repeated periodically and/or after switching actions, i.e. after each change in the instantaneous topology. The plausibility test of the current transformers 7 can be carried out regardless of any switching actions and can be repeated when inconsistencies of the measurement signals caused by switching actions occur. As an alternative, the plausibility test of the current transformers 7 is only carried out or evaluated when a previous checking for instantaneous switching actions has proven to be negative. The plausibility test can also be carried out when current transformers 7 are taken into operation, to provide early detection of inconsistencies in their measurement value parametrisation.

An asynchronism of the measurement signals of a zone 1a, 1b, 1c can be measured or estimated and the greater the asynchronism, the greater the permitted current transformer inaccuracy which can be selected.

The results of the plausibility test can be represented in the form of a list of the current transformers 7 with their zone allocation, as statistics of the frequency with which each current transformer 7 has been identified as being problematic and/or as graphical, particularly colored information in a single-pole diagram of the switchgear 1. Preferably, the current transformers 7 are measuring-type current transformers 7, the measuring signals are effective current measurement values of the current transformers 7, in particular RMS values, and/or the current-direction-dependent sign is determined from a phase angle between voltage and current of a phase, between currents of different phases or in other ways.

In another aspect, an exemplary embodiment of the invention relates to a computer program product for the plausibility checking of voltage transformers 8 in an electrical switchgear 1, comprising a computer-readable medium and computer-readable program code means which, when executed on a data processing means of a control system 2 of the electrical switchgear 1 cause the data processing means to execute the method described above. Furthermore, a computer program for the plausibility checking of current transformers 7 in an electrical switchgear 1, which can be loaded and executed on a data processing unit of a control system 2 of the switchgear 1 is claimed, wherein the computer program, when executed, executes the steps of the method represented above.

In a further aspect, an exemplary embodiment of the invention relates to a device 20 for carrying out the method for the plausibility checking of current transformer 7. The device comprises means 2a for recording the instantaneous switchgear topology, means 2b for detecting at least one switchgear zone 1a, 1b, 1c, defined as conductive area 1a, 1b, 1c bounded by at least one current transformer 7 and possibly open switches 3–5, means 2c for detecting the measuring signals of the current transformers 7 in the zone 1a, 1b, 1c with a current-direction-dependent sign and for adding the measuring signals to form a current sum of the zone 1a, 1b, 1c, and means 2d for testing the current sum for a value of zero within a permitted current transformer measurement accuracy and for marking the current transformers 7 of the zone 1a, 1b, 1c as problematic if the current sum is not equal to zero. Preferably, the device 20 comprises a warning counter 2e for monitoring the frequency with which a current transformer 7 is identified as being problematic, and/or means 2f for carrying out the method represented above.

The device 20 can be a station monitoring device 20, which can be connected to the substation control system 2, or it can be integrated in an operating interface of the control system 2. Furthermore, all device means 2a-2f mentioned can be implemented in hardware and/or software.

Exemplary embodiments of the invention also extend to an electrical switchgear 1 which comprises such a device 20.

LIST OF REFERENCE SYMBOLS

Electrical switchgear
1a, 1b, 1c Sections of the topology, zones
2 control system
20 Device for the plausibility checking
2a Means for topology recording
2b Means for detecting a zone
2c Means for measurement signal detection
2d Means for current sum testing
2e Warning counter
2f Execution means
3 Circuit breaker
4 Isolator
5 Earthing isolator
6 Busbar
7 Current transformer
7a Measuring point of a current transformer
8 Voltage transformer
9 Outgoing lines.

What is claimed is:

1. A method for the plausibility checking of current transformers in an electrical switchgear, the switchgear being controlled by a control system and measurement signals from current transformers arranged at at least two different measuring points being processed by the control system, wherein, for testing the plausibility checking of the current transformers,
   an instantaneous topology of the switchgear is detected by the institution control system based on existing electrical connections of primary devices and based on instantaneous positions of switches,
   based on the instantaneous topology, at least one zone of the switchgear is identified, which zone represents a conductively connected area which is bounded by at least one current transformer,
   in the zone, the measurement signals of the current transformers are detected with a current-direction-dependent sign and are added to form a current sum of the zone, and
   if there is a current sum which is not equal to zero within a permissible current transformer measuring accuracy, all current transformers of the associated zone are identified as being problematic.

2. The method as claimed in claim 1, wherein
   in each test for the presence of a current sum not equal to zero, a warning counter for the current transformers identified as being problematic in the associated zone is incremented,
   in each zone, the same number of tests for the presence of a current sum not equal to zero is performed, and
   current transformers having a higher warning count than other current transformers, particularly having a highest warning count, are identified as being defective.

3. The method as claimed in claim 1, wherein
   there is at least one zone having a number of current transformers, and
   the warning counters of the current transformers of this zone are reset to zero if a current sum equal to zero is measured in the zone and a measurement signal not equal to zero is measured by at least two current transformers of the zone.

4. The method as claimed in claim 1, wherein, in a zone having exactly one current transformer, the current transformer is identified as being defective if its measurement signal is repeatedly not equal to zero.

5. The method as claimed in claim 1, wherein
   each current transformer of the switchgear is divided into at least one zone, and
   in an overall test of the switchgear exactly one test for the presence of a current sum not equal to zero is performed in each zone.

6. The method as claimed in claim 1, wherein
   the identification of the zones is based on starting from a busbar of the switch gear assembly and searching out all current transformers conductively connected thereto and/or
   two zones of the switchgear are identified which are adjacent to one another and which adjoin one another via a common current transformer and if the common current transformer fails or if the common current transformer is detected as being defective, the two zones are automatically combined to form a single zone.

7. The method as claimed in claim 1, wherein, when exactly one current transformer fails in one zone, a current measurement signal to be detected by this current transformer is calculated from the remaining current measurement signals of the zone, assuming that the current sum is equal to zero.

8. The method as claimed in claim 1, wherein the plausibility check of the current transformers is performed separately for each phase or alternately for different phases.

9. The method of claim 8, wherein the plausibility check of the current transformers is performed in a cyclically alternating fashion.

10. The method as claimed in claim 1, wherein
    in the operating state, tests for the presence of a current sum not equal to zero and, particularly, overall tests of the switchgear are repeated periodically and/or after switching actions, and/or
    the plausibility check of the current transformers is carried out regardless of any switching actions and is repeated in the case of inconsistencies of the measurement signals caused by switching actions or the plausibility check of the current transformers is only carried out or evaluated if a previous check for instantaneous switching actions has had a negative result.

11. The method as claimed in claim 1, wherein in the operating state of the switchgear, an asynchronism of the measurement signals of a zone is measured or estimated and, the greater the asynchronism, the greater the permitted current transformer inaccuracy to be selected.

12. The method as claimed in claim 1, wherein results of the plausibility check are represented in the form of a list of the current transformers with their zone allocation, as statistics of the frequency with which each current transformer has been identified as being problematic.

13. The method of claim 12 wherein results of the plausibility check are represented as graphical information in a single-pole diagram of the switchgear.

14. The method of claim 13 wherein the graphical information includes colors.

15. The method as claimed in claim 1, wherein
the current transformers are measuring-type current transformers and/or
the measurement signals are effective current measurement values of the current transformers and/or
the current-direction-dependent sign is determined from a phase angle between voltage and current of a phase or between currents of different phases.

16. A computer program for the plausibility checking of current transformers in an electrical switchgear, which can be loaded and executed on a data processing unit of a control system of the switchgear, wherein the computer program, when executed, executes the steps of the method as claimed in claim 1.

17. The method of claim 1, wherein the electrical switch gear assembly is a high-voltage or medium-voltage switch gear assembly.

18. The method of claim 1, wherein the zone represents a conductively connected area which is bounded by open switches.

19. The method of claim 1, wherein the plausibility check of the current transformers is performed for average values of at least two phases.

20. The method of claim 19, wherein the plausibility check of the current transformers is performed for average values of all phases.

21. A device for the plausibility checking of current transformers in an electrical switchgear, the device comprising:
means for detecting an instantaneous topology of the switchgear based on the the existing electrical connections of primary devices and based on the instantaneous positions of switches,
means for detecting at least one zone of the switchgear, which zone represents a conductively connected area which is bounded by at least one current transformer,
means for detecting the measurement signals of the current transformers in the zone with a current-direction-dependent sign and for adding the measurement signals to form a current sum of the zone, and
means for checking the current sum for a value of zero within a permitted current transformer measurement accuracy and for marking the current transformers of the zone as being problematic if the current sum is not equal to zero.

22. The device as claimed in claim 21, wherein
there is a warning counter for carrying out the method, and/or
there are means for carrying out the method.

23. The device of claim 21, wherein zone represents a conductively connected area which is bounded by open switches.

* * * * *